United States Patent
Simburger et al.

(10) Patent No.: US 6,791,411 B1
(45) Date of Patent: Sep. 14, 2004

(54) POWER AMPLIFIER AND A METHOD FOR OPERATING A POWER AMPLIFIER

(75) Inventors: Werner Simburger, Haar (DE); Wilhelm Wilhelm, Munich (DE); Peter Wegar, Frankfurt an der Oder (DE)

(73) Assignee: Infineon Technologies, AG (DE)

( * ) Notice: Subject to any disclaimer, the term of this patent is extended or adjusted under 35 U.S.C. 154(b) by 163 days.

(21) Appl. No.: 10/148,746
(22) PCT Filed: Nov. 17, 2000
(86) PCT No.: PCT/DE00/04051
 § 371 (c)(1),
 (2), (4) Date: Nov. 18, 2002
(87) PCT Pub. No.: WO01/41300
 PCT Pub. Date: Jun. 7, 2001

(30) Foreign Application Priority Data

Dec. 3, 1999 (DE) .......................................... 199 58 442

(51) Int. Cl.⁷ .......................... H03F 3/217; H03F 3/45; H01L 29/00
(52) U.S. Cl. ........................ 330/251; 330/255; 257/497
(58) Field of Search ............................... 330/251, 255; 257/497

(56) References Cited

U.S. PATENT DOCUMENTS

| | | | |
|---|---|---|---|
| 3,898,575 A | | 8/1975 | Hanspector |
| 4,384,217 A | * | 5/1983 | Tsividis ........................ 327/541 |
| 5,164,679 A | | 11/1992 | Dittmer |
| 5,623,228 A | * | 4/1997 | Arbel ........................... 330/110 |
| 5,856,760 A | | 1/1999 | Lam et al. |
| 5,929,502 A | * | 7/1999 | Beasom ......................... 257/497 |
| 6,563,381 B1 | * | 5/2003 | Strong ........................... 330/253 |

FOREIGN PATENT DOCUMENTS

| | | |
|---|---|---|
| DE | 35 86 368 T2 | 1/1993 |
| FR | 1 328 016 A | 9/1963 |
| JP | 59 012 609 A | 1/1984 |

OTHER PUBLICATIONS

Patent Abstract of Japan vol. 008, No. 095 (E–242), May 2, 1984, Tokyo Shibaura Denki KK.
Meinki; Gundlach; Taschenbuch der Hochfrequenztechnik, 5, Auflage, Berlin: Springer, 1992, SF34–SF35.
M. Rickelt und H.–M Rein "Impact–Ionization Induced Instabilities in High–Speed Bipolar Transistors and their Influence on the Maximum Usable Output Voltage".

* cited by examiner

*Primary Examiner*—Patricia Nguyen
(74) *Attorney, Agent, or Firm*—Jeffrey R. Stone; Briggs and Morgan, P.A.

(57) ABSTRACT

According to the invention, the high-frequency power amplifier is characterised in that the power transistor is switched in such a way that said transistor is operated in the breakdown region and that a control loop is provided. Charge carriers that are produced is the breakdown region are carried away from an output of the operational amplifier by means of said control loop.

7 Claims, 3 Drawing Sheets

POWER AMPLIFIER AND A METHOD FOR OPERATING A POWER AMPLIFIER

The invention relates to a power amplifier with at least one power transistor.

The invention furthermore relates to a method for operating a power amplifier which contains at least one power transistor.

Transistor amplifiers are used even at very high frequencies When designing the circuit, it is known for consideration to be given not only to the transistor characteristics at high frequencies but also to the radio-frequency characteristic of components and lines. All the complex four-pole parameters of the transistor are thus taken into account in radio-frequency circuits.

It is furthermore known, when designing integrated radio-frequency power amplifiers, for it to be necessary to find a compromise between a high voltage resistance (beakdown) and a high switching speed (high efficiency). If it is intended to achieve good characteristics at low operating voltages, a high transit frequency is required, with a high current gain.

The article "Impact-Ionization Induced Instabilities in High-Speed Bipolar Transistors and their Influence on the Maximum Usable Output Voltage" by M. Rickelt and H.-M. Rein describes that the breakdown characteristic of a bipolar transistor depends on the doping and thickness of a collector region of the transistor. The article furthermore describes that a collector current $I_c$ rises sharply as the collector-emitter voltage $V_{CE}$ rises (breakdown). Circuits for setting quiescent currents in a transistor are known from Meinke, Gundlach: Taschenbuch der Hochfrequenztechnik [Radio Frequency Technology Manual], 5th edition, Berlin, Springer, pages F34–F35, 1992.

Furthermore, a radio frequency amplifier circuit using power transistors is known from DE 35 86 368 T2. In this known amplifier circuit, a path which conducts direct current is provided between the operating potential source and the reference ground potential, through a first transistor and a second transistor connected in series. The operating potential of the source is in consequence split between the transistors on the basis of the detect-current series path, so that each transistor has an equal share of the direct current power, while separate, parallel alternating current signal paths are provided by each transistor, and are combined at the output.

The invention is bad on the object of providing a power amplifier of this generic type, which has high gain. The power amplifier according to the invention should preferably have a transit frequency which is as high as possible.

According to the invention, this object is achieved in that a power amplifier of this generic type is designed such that the power transistor is connected such that it is operated in the breakdown region, and such that a control loop is provided, by means of which charge carriers produced in the breakdown are carried away from one output of the operational amplifier.

The invention provides for a power amplifier with one or more power transistors to be operated such that at least one of the power transistors is in a breakdown region. The breakdown region is designed such that the respective power transistor is not destroyed by it.

The invention makes use of the fact that the gradient of the collector current $I_c$ is dependent on the auxiliary voltage (bias voltage). A change in the source impedance of the bias drive, in particular a low-impedance bias drive, considerably reduces the rise in the collector current $I_c$, so that the operational reliability is improved considerably, even at high operating voltages.

It is particularly advantageous to design the power transistor such that the control loop contains at least one transistor.

One particularly expedient embodiment of the power amplifier, or of the method for its operation, is distinguished in that the transistor in the control loop is connected in parallel with the power transistor.

It is particularly advantageous to design the power amplifier, or to carry out the method for its operation, such that the control loop has a long time constant in comparison to a time constant for charge carrier multiplication, and combination with at least one diode results in improved operational reliability in the breakdown region.

The subject matter of the invention is furthermore to carry out a method for operation of at least one transistor such that the transistor is operated at a constant operating point $I_c$.

In this case, it is advantageous for the operating point to be set by means of a control loop. The loop gain of the control loop is preferably kept low, in order to provide better stability. If driven by radio frequency signals, a rise in a mean quiescent current is expediently deliberately allowed. This makes it possible for the power amplifier to operate more efficiently at radio frequencies. For example, in the case of a radio frequency drive, a rise in the mean base voltage by, for example, 25 mV results in the collector current rising by a factor of 2.7.

Further advantages, special features and expedient developments of the invention can be found from the dependent claims and the following description of preferred exemplary embodiments with reference to the drawings, in which:

Figure 1:
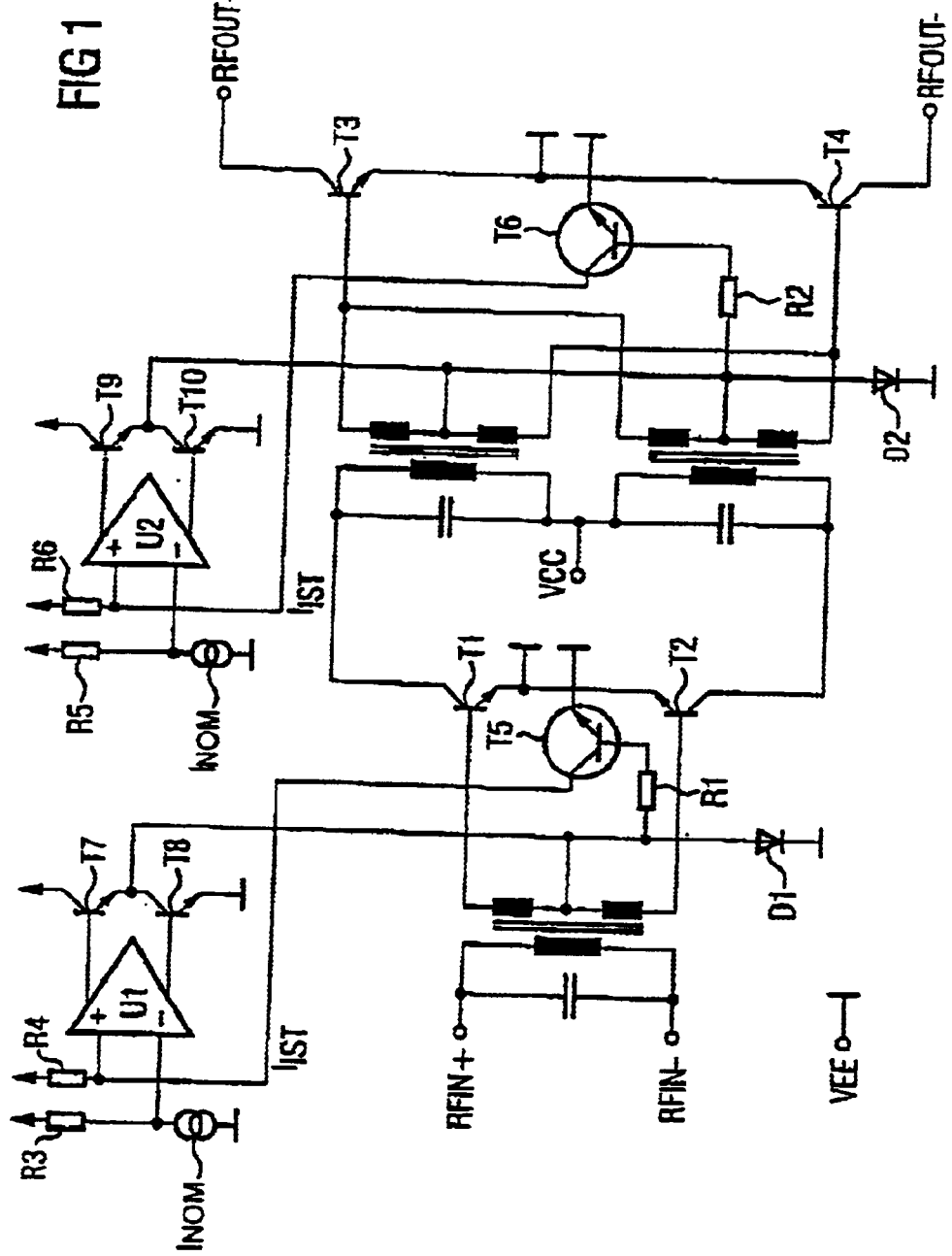
FIG. 1 shows a circuit arrangement for quiescent current adjustment.

The circuit arrangement illustrated in FIG. 1 is preferably a part of an integrated radio frequency power amplifier. The circuit arrangement has a number of power transistors T1, T2, T3 and T4. The number of power transistors is variable, and is expediently matched to the power gain to be achieved.

The power transistors T1, T2, T3 and T4 are connected such that they can be operated in the breakdown region. The quiescent current is largely independent of the breakdown characteristic of the power transistors T1, T2, T3 and T4.

The power transistors T1, T2, T3 and T4 are preferably high-speed bipolar transistors with a high gain and a high switching speed. The power transistors T1, T2, T3 and T4 have a low breakdown voltage.

A preferred method of operation will be described in the following text with reference to the circuit arrangement illustrated in FIG. 1, by means of which method of operation the transistors are operated in the region of moderate charge carrier multiplication. The circuit arrangement is designed such that the stability and reliability are increased in the operating region of moderate charge carrier multiplication.

The power transistors T1 and T2 form a driver stage, whose quiescent current is adjusted by means of a control loop. The control loop comprises an operational amplifier U1 with transistors T7, T8. The control loop also contains a further transistor T5, which is operated as a "measurement transistor" and provides a measure for the quiescent current in the transistors T1 and T2.

The present concept results in a stable operating point $I_c$=CONSTANT via a suitable control loop, in particular via a control loop which contains at least one operational amplifier. This operational amplifier has a complementary output, in particular a push-pull output with NPN transistors T7, T8, and T9, T10, by means of which the bases of T7, T8 and T9, T10 are driven such that they have a low impedance. In consequence $V_{BE}=f(V_{CE})$, with the collector current $I_c$ being constant. A range of output characteristics for which $I_c$=CONSTANT thus curves upward only at a higher $V_{CE}$ than would be the case if $V_{BE}$=CONSTANT or $I_E$=CONSTANT. With $I_c$=CONSTANT, the invention approximates the ideal case of $J_E$=0. The invention thus provides for the drive condition $I_E$=0, with which no power amplification can be achieved, to be replaced by a condition with which power amplification is achieved, but with the conditions otherwise being largely the same.

The circuit preferably contains diodes D1, D2 which also result in a low dynamic internal resistance with a considerably shorter time constant than that of the control loop, thus improving the operational reliability in the breakdown region.

The nominal value is preset by means of a control current $I_{NON}$, which is converted by means of a resistor $R_3$ to a comparison voltage. In order to determine an actual value of the current through the power transistors T1 and T2, the transistor T5 is connected in parallel with the power transistors T1 and T2. In the illustrated case, the emitter surface area relationships are set such that the collector current which flows through the transistor T5 is less than the collector current which flows through the power transistors T1 and T2. Preferably, $I_c(T1)=I_c(T2)=6\times I_c(T5)$. The collector current $I_c(T5)$ through the transistor T5 is converted across a resistor $R_4$ to a voltage, and is compared with a nominal value. The control loop is closed by the operational amplifier U1.

Since the transistors T1, T2, T5 are operated in the breakdown region, their output family of characteristics (FIG. 1) is curved upward. The increase in the curvature and the point (VCE) at which the curvature starts are substantially dependent on the internal impedance of the base drive and on the absolute value of the collector current at the knee voltage (small VCE).

However, since T5 has a resistor R4 in the collector line while T1 and T2 do not, their output families of characteristics are not the same (curvature and threshold voltage different), since the collector voltage applied to T1, T2, T5 is not the same. (This could also be achieved by means of a resistor $R_c=1/6*R4$ in the collector lines T1, T2; however, this is deliberately avoided in order to avoid the efficiency of the power amplifier being made worse.) The family of characteristics for T5 may, however, be matched by means of a resistor R1 in the base line of T5 to the family of characteristics of T1, T2, as a result of which the $I_c$ of T5 is an accurate measure of the $I_c$ in T1 and T2; this is despite the transistors being operated in the breakdown region (region of the curvature in the output family of characteristics).

The curvature of the output family of characteristics is shifted toward a higher $V_{CE}$ when the internal impedance of the drive source of T1, T2 is low, as close as possible to 0 Ohms. It is therefore expedient to use a special operational amplifier U1. One such operational amplifier U1 is shown by way of example in FIG. 2. The operational amplifier U1 has a push-pull output T1, T2.

The main features of the operational amplifier arm operation at low supply voltages from 2.5 V, a low output impedance, and a suitable output, in particular an NPN push-pull output.

In order to further reduce the preferably dynamic internal impedance of the control source T7, T8 for the bases of T1, T2, a diode D1 is connected in parallel with the bases T1, T2, preferably via the center tap of the transformers. This contributes to further increasing the stability.

The quiescent current adjustment of the output stage T3, T4 is carried out using the same principle as for the driver stage T1, T2; however, the currents are greater by a factor of approximately 10 to 20.

The operational amplifier U1 whose fundamental principles arm illustrated in FIG. 1 is illustrated in detail in FIG. 2.

Figure 2A:
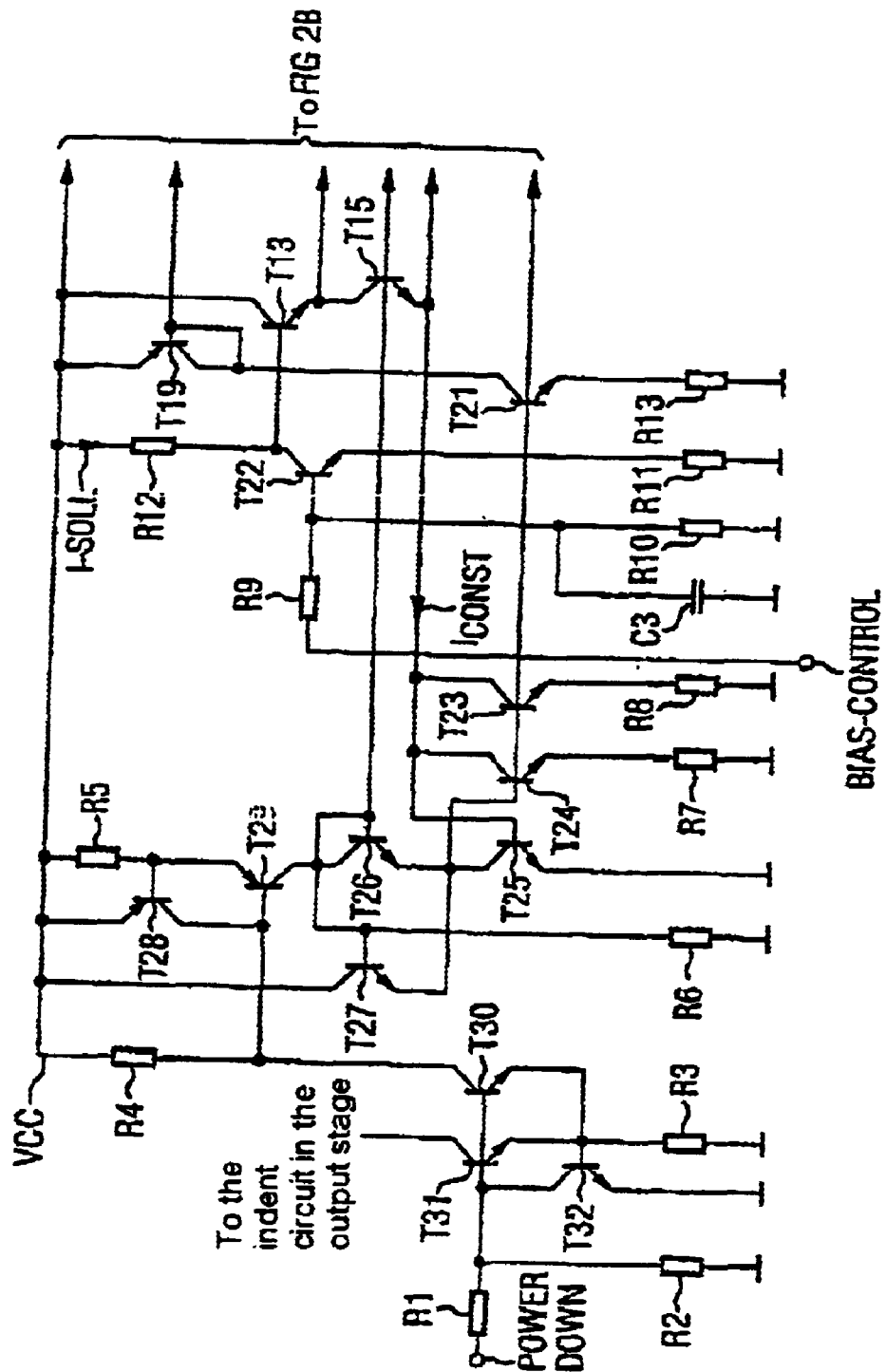
FIG. 2 shows an operational amplifier with a push-pull output for low supply voltages.
Figure 2B:
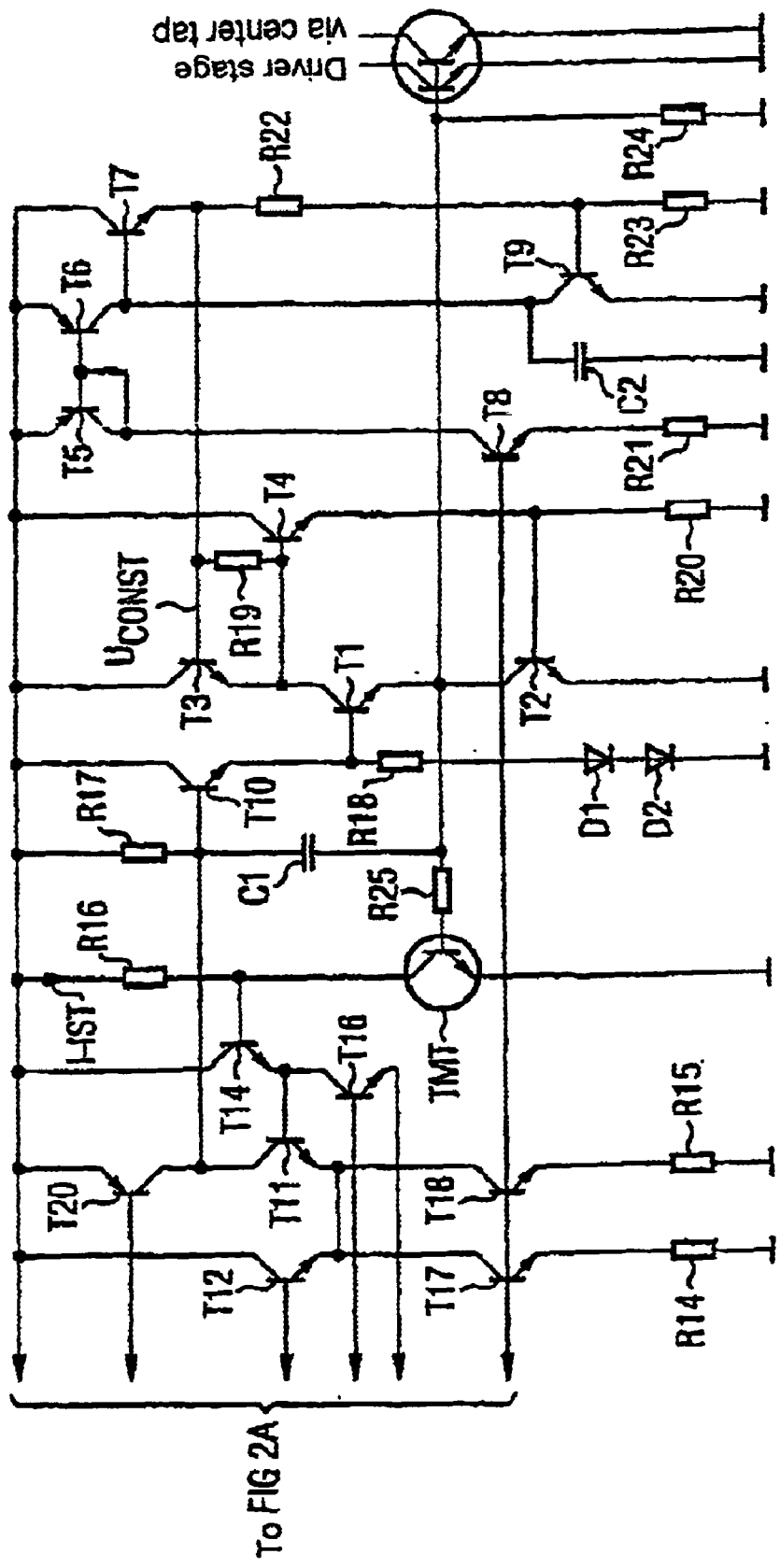

In order to improve the circuit characteristics further, further transistors and resistors have been used in the embodiment illustrated in FIG. 2a and FIG. 2b.

R3, R4, T7, T8 and R5, R6, T9, T10 in FIG. 1 correspond to R12, R16, T1, T2 in FIG. 2.

T5, R1 and T6, R2 in FIG. 2 correspond to TMT and R25 in FIG. 2.

The transistors T1, T2 and T3, T4 in FIG. 1 are illustrated as "marked double transistors" in FIG. 2 (on the right, adjacent to R24).

The diodes D1 and D2 in FIG. 1 are not shown in FIG. 2.

The operational amplifier (OPV) has a reference network, which can be switched off, for adjusting the OPV's own quiescent currents. The reference network comprises T27, T26, T25, T23, T24, T15, T16, R6, R7, R8 and generates a current $I_{CONST}$ which is largely independent of the supply voltage (VCC). The circuit of the reference network is prior art, and can be implemented in a wide range of forms. The reference network can be switched off by means of R1, R2, T32, T31, R3, T30, R4, T28, R5, T29, T29 supplies a current which is largely independent of VCC and which can be activated by the power down input with a switching threshold of 1.2 V. The collector current of T29 supplies the bias current for the reference network. $I_{CONST}$ is mirrored by T21, T17, T18 and T8, and is used further in scaled form.

The inverting input of the OPV is the base of T13. The non-inverting input of the OPV is the base of T14. The comparison voltages across the resistors R12 and R16 (I-Nom and I-Act) arm passed on via the emitter followers T13 and T14, and the OPV core T12 and T11. Both emitter followers T13, T14 carry a quiescent current of $I_{CONST}/2$. An output current is supplied to the base of T10, corresponding to the difference input voltage at the bases of T11 and T12. T10 drives the base of the output transistor T1. The complementary path for T1 comprises T2, R20, T3, R19 and T4.

When the OPV supplies a positive output current, T1 is active. When the OPV supplies a negative output current, T2 is active. T3 is connected in cascade with T1. When the current through T1 (and T3) is high, the high BE voltage across T3 in consequence reduces the base voltage of T4 and hence of T2 (T2 is inactive).

Conversely, T2 becomes active (via T3, T4) and T1 is inactive. This results in a simple complementary output T1, T2, composed exclusively of NPN transistors. The cascade voltage $U_{const}$ of T3 is produced by the network T8, T5, T6, T7, R22, R23, T9. C2 guarantees that T2 becomes active earlier than T1 when the supply voltage is switched on. This protects the RF power transistors (T1, T2 and T3, T4 in FIG. 2) against being destroyed when the supply voltage is switched on, that is to say on power up.

C1 is used for frequency compensation of the OPV (prior art). R18, D1, D2 improves the dynamic response.

R17 reduces the power-down decay time.

R9, R19, C3, T22, R11 form a simple voltage/current converter for the nominal value preset I-NOM. The control voltage is supplied at the "BIAS CONTROL" pin.

The output family of characteristics of the "measurement transistor" TMT (in comparison to the output family of characteristics of T1, 72 and T3, T4 in FIG. 2), which is modified by R16, is matched by means of R25.

The circuit also contains further resistors R10, R14, R15, R17 and a transistor T19.

List of Reference Symbols
D1 Diode
D2 Diode
R3 Resistor
R4 Resistor
R5 Resistor
R6 Resistor
R8 Resistor
R9 Resistor
R10 Resistor
R11 Resistor
R13 Resistor
R14 Resistor
R15 Resistor
R16 Resistor
R17 Resistor
R18 Resistor
R19 Resistor
R20 Resistor
R21 Resistor
R22 Resistor
R23 Resistor
R24 Resistor
T1 Transistor
T2 Transistor
T3 Transistor
T4 Transistor
T5 Transistor
T6 Transistor
T7 Transistor
T8 Transistor
T9 Transistor
T10 Transistor
T13 Transistor
T15 Transistor
T19 Transistor
T21 Transistor
T22 Transistor
T23 Transistor
T24 Transistor
T25 Transistor
T26 Transistor
T27 Transistor
T28 Transistor
T29 Transistor
T30 Transistor
T31 Transistor
T32 Transistor

What is claimed is:

1. A high frequency power amplifier comprising:
   at least one power transistor, in which the power transistor is connected such that it is operated in the breakdown region;
   a control loop, the control loop comprising at least one operational amplifier; and
   wherein charge carriers produced in the breakdown are carried away from one output of the at least one operational amplifier.

2. The power amplifier as claimed in claim 1, in which the control loop contains at least one transistor.

3. The power amplifier as claimed in claim 2, in which the transistor in the control loop is connected in parallel with the power transistor.

4. The high frequency power amplifier as claimed in claim 1, in which the control loop has a long time constant in comparison to a time constant for charge carrier multiplication, the power amplifier further comprising at least one diode resulting in improved operational reliability in the breakdown region.

5. A method for operating a power amplifier, the power amplifier including at least one power transistor, the method comprising:
   operating the power amplifier in the breakdown region;
   producing charge carriers during operation of the power amplifier in the breakdown region; and
   carrying the charge carriers away from one output of the operational amplifier.

6. The high frequency power amplifier as claimed in claim 2 in which the control loop has a long time constant in comparison to a time constant for charge carrier multiplication, the power amplifier further comprising at least one diode resulting in improved operational reliability in the breakdown region.

7. The high frequency power amplifier as claimed in claim 3, in which the control loop has a long time constant in comparison to a time constant for charge carrier multiplication, the power amplifier further comprising at least one diode resulting in improved operational reliability in the breakdown region.

* * * * *

UNITED STATES PATENT AND TRADEMARK OFFICE
CERTIFICATE OF CORRECTION

PATENT NO. : 6,791,411 B1
DATED : September 14, 2004
INVENTOR(S) : Werner Simburger, Wilhelm Wilhelm and Peter Weger It is certified that error appears in the above-identified patent and that said Letters Patent is hereby corrected as shown below:

Title page,
Item [75], Inventor, please replace "Wegar" with -- Weger --;
Item [57], ABSTRACT, the line beginning with "Charge", please replace "is" with -- in --.

Column 1,
Line 47, please replace "bad" with -- based --.

Column 3,
Line 10, please replace "J" with -- I --.

Column 4,
Line 1, please replace "12" with -- T2 --;
Line 9, please replace "arm" with -- are --;
Line 29, please replace "T29," with -- T29. --.

Signed and Sealed this

Thirty-first Day of May, 2005

JON W. DUDAS
*Director of the United States Patent and Trademark Office*